(12) United States Patent
Herr

(10) Patent No.: US 8,610,453 B2
(45) Date of Patent: *Dec. 17, 2013

(54) SINGLE FLUX QUANTUM CIRCUITS

(75) Inventor: Quentin P. Herr, Ellicott City, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 40 days.

This patent is subject to a terminal disclaimer.

(21) Appl. No.: 13/167,188

(22) Filed: Jun. 23, 2011

(65) Prior Publication Data

US 2011/0254583 A1    Oct. 20, 2011

Related U.S. Application Data

(63) Continuation of application No. 12/718,571, filed on Mar. 5, 2010, now Pat. No. 7,977,964, which is a continuation of application No. 11/956,293, filed on Dec. 13, 2007, now Pat. No. 7,724,020.

(51) Int. Cl.
   *H03K 19/195* (2006.01)
(52) U.S. Cl.
   USPC ........................................ 326/4; 326/6; 326/7

(58) Field of Classification Search
   USPC .......................................... 326/1–7
   See application file for complete search history.

(56) References Cited

U.S. PATENT DOCUMENTS

| | | | |
|---|---|---|---|
| 4,117,354 A * | 9/1978 | Geewala | 326/5 |
| 4,916,335 A * | 4/1990 | Goto et al. | 327/528 |
| 5,309,038 A * | 5/1994 | Harada et al. | 327/186 |
| 6,242,939 B1 * | 6/2001 | Nagasawa et al. | 326/3 |
| 6,483,339 B1 * | 11/2002 | Durand et al. | 326/5 |
| 6,518,786 B2 * | 2/2003 | Herr | 326/3 |
| 7,724,020 B2 * | 5/2010 | Herr | 326/3 |
| 7,977,964 B2 * | 7/2011 | Herr | 326/4 |
| 2005/0023518 A1 * | 2/2005 | Herr | 257/13 |

* cited by examiner

*Primary Examiner* — Jason M Crawford
(74) *Attorney, Agent, or Firm* — Tarolli, Sundheim, Covell & Tummino LLP

(57) ABSTRACT

Superconducting single flux quantum circuits are disclosed herein, each having at least one Josephson junction which will flip when the current through it exceeds a critical current. Bias current for the Josephson junction is provided by a biasing transformer instead of a resistor. The lack of any bias resistors ensures that unwanted power dissipation is eliminated.

16 Claims, 9 Drawing Sheets

SINGLE FLUX QUANTUM CIRCUITS

RELATED APPLICATION

This application is a continuation application of U.S. Ser. No. 12/718,571, filed Mar. 5, 2010 (now U.S. Pat. No. 7,977,964, issued Jul. 12, 2011); which is a continuation of U.S. Ser. No. 11/956,293 filed Dec. 13, 2007 (now U.S. Pat. No. 7,724,020, issued May 25, 2010); which claims the filing-date benefit of U.S. Ser. No. 11/654,632, filed Jan. 18, 2007 (now abandoned), the specifications of which are incorporated herein in entirety.

BACKGROUND OF THE INVENTION

1. Field of the Invention

This invention, in general, relates to superconductor circuits and, more particularly, to superconductor circuits which utilize superconducting Josephson junctions.

2. Description of the Prior Art

In the field of digital logic extensive use is made of well known and highly developed CMOS (complimentary metal-oxide semiconductor) technology. As CMOS has begun to approach maturity as a technology, there is an interest in alternatives that may lead to higher performance in terms of speed, power dissipation computational density, interconnect bandwidth, and the like.

An alternative to CMOS technology comprises superconductor based single flux quantum circuitry, utilizing superconducting Josephson junctions, with typical signal power of around 4 nW (nanowatts), at a typical data rate of 20 Gb/s (gigabytes/second), or greater, and operating temperatures of around 4.degree. Kelvin.

As will be subsequently described, the Josephson junction is an active device supplied with a DC bias and the power budget in such circuits is dominated by static power consumption which happens whether or not the active device is switching. It would be desirable to reduce power consumption including elimination of static power dissipation in such circuits.

SUMMARY OF THE INVENTION

Accordingly, it is an object of the present invention to reduce or eliminate unnecessary power dissipation in single flux quantum Josephson junction circuits.

This and other objects of the present invention are provided by a superconducting single flux quantum circuit comprising at least one Josephson junction which is provided with an input pulse and which flips and provides an output pulse when the current through the Josephson junction exceeds a critical value. The circuit is completely devoid of any resistors that would provide a bias current to the Josephson junction.

Further scope of applicability of the present invention will become apparent from the detailed description provided hereinafter. It should be understood, however, that the detailed description and specific example, while disclosing the preferred embodiment of the invention, is provided by way of illustration only, since various changes and modifications within the spirit and scope of the invention will become apparent to those skilled in the art, from the detailed description.

BRIEF DESCRIPTION OF THE DRAWINGS

The present invention will become more fully understood from the detailed description provided hereinafter and the accompanying drawings, which are not necessarily to scale, and are given by way of illustration only, and wherein.

DETAILED DESCRIPTION

Figure 1:
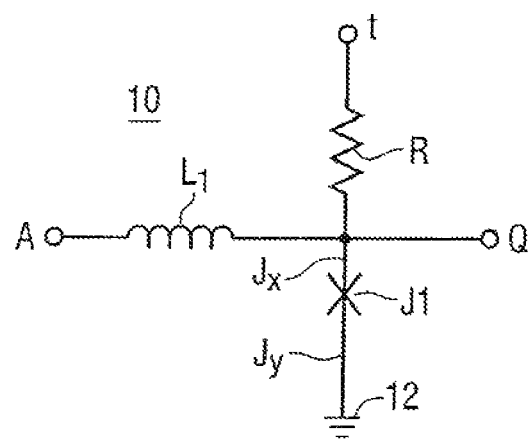
FIG. 1 is a diagram of a prior art single flux quantum Josephson junction circuit.

Referring now to FIG. 1, there is shown a superconducting circuit 10 having a single Josephson junction J1 designated by the symbol "X" and having first and second terminals $J_x$ and $J_y$, as do all of the Josephson junctions described herein. Basically, a Josephson junction is comprised of two layers of superconductors separated by a very thin layer of an insulator. When cooled to superconducting temperatures and biased with a DC current below a certain critical current $I_C$ the Josephson junction is superconducting and conducts current without developing a voltage drop and exhibiting substantially no electrical resistance.

When an input voltage pulse, called a single flux quantum pulse, derived from a previous superconducting circuit is applied, sufficient bias current is supplied to attain the critical current. At this point the Josephson junction triggers, or "flips" and generates a single flux quantum output pulse in response to the single flux quantum input pulse. Such circuits may be used to feed a plurality of subsequent circuits or for impedance matching purposes.

Figure 1A:
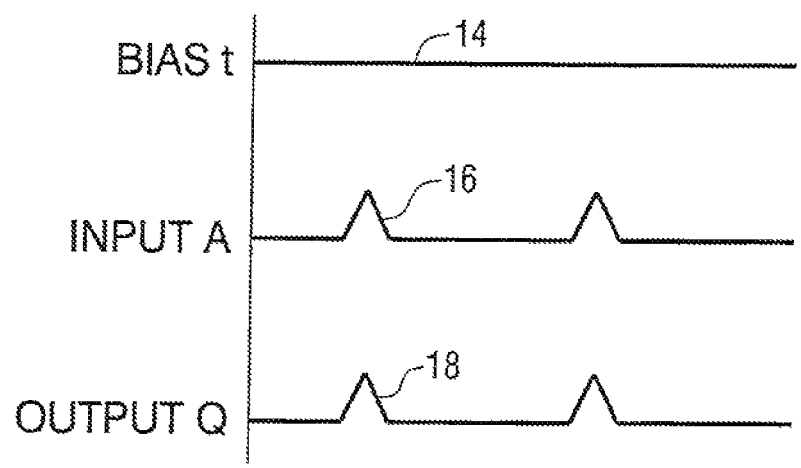
FIG. 1A is illustrative of waveforms associated with the circuit of FIG. 1.

In FIG. 1, a DC bias current is supplied to Josephson junction J1 via terminal t through resistor R flows to ground 12. This DC bias current is depicted by waveform 14 of FIG. 1A. An input A pulse 16, in FIG. 1A, is applied to input terminal A of FIG. 1 and through inductor $L_1$. When the critical current $I_C$ through Josephson junction J1 is attained, an output pulse 18 is generated at output terminal Q. The DC current through resistor R represents an unwanted static power dissipation which generates objectionable heat. In order to compensate for this heat, additional cooling requirements must be applied to the superconducting circuit.

Figure 2:
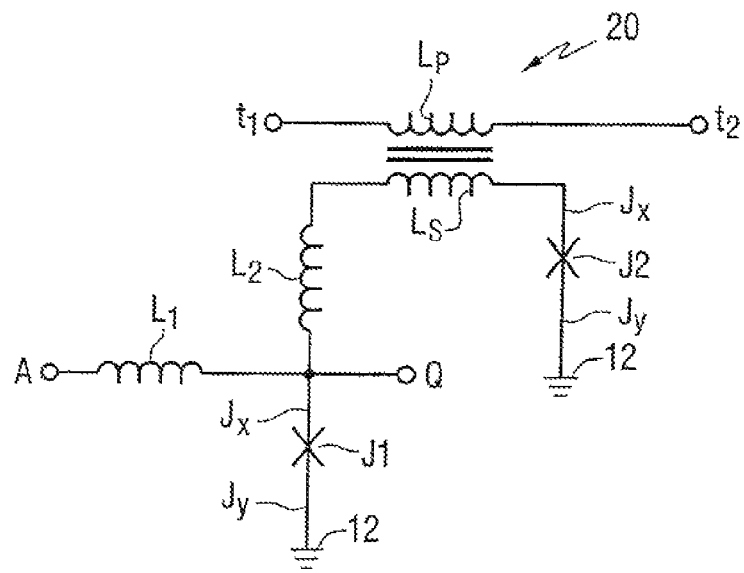
FIG. 2 is a diagram illustrating one embodiment of the present invention.

FIG. 2 illustrates an embodiment of the present invention which completely eliminates the requirement for the heat dissipating resistor R of FIG. 1. The circuit of FIG. 2 includes, similar to FIG. 1, a Josephson junction J1 is directly connected to ground 12 via $J_y$. The circuit similarly includes input terminal A connected to Josephson junction J1 through a first inductor $L_1$, defining an input inductor. The circuit also includes an output terminal Q.

Figure 2A:
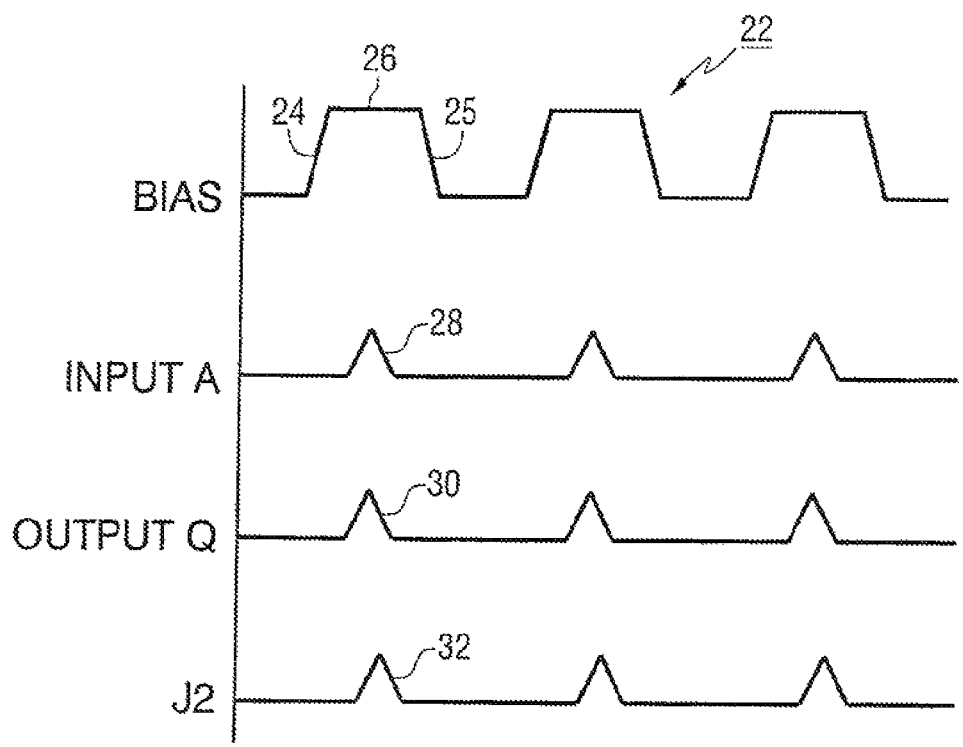
FIG. 2A illustrates waveforms associated with the circuit of FIG. 2.

The circuit of FIG. 2 presents a biasing arrangement devoid of any resistors and which includes a superconducting biasing transformer 20 having primary and secondary windings $L_P$ and $L_S$. An AC bias current, as depicted by waveform 22 of FIG. 2A, is applied across terminals $t_1$ and $t_2$ of transformer 20. By way of example, the AC bias current waveform 22 is a trapezoidal waveform which includes a leading edge 24, a trailing edge 25, with the two being joined by a horizontal portion 26. Bias current from secondary winding $L_S$ is supplied to Josephson junction J1 through a second inductor $L_2$. Current also travels up from ground 12 through a second Josephson junction J2, but at a current value less than its critical current.

Sometime during the application of horizontal portion 26 of waveform 22, an input voltage pulse 28, FIG. 2A, is applied to input terminal A. When the critical current $I_C$ is attained, Josephson junction J1 flips and an output pulse 30 is generated at output terminal Q. This flipping action also causes a current to travel up through inductor $L_2$, and through inductor $L_S$ and Josephson junction J2. This reverse current through Josephson junction J1 would normally prevent its resetting and subsequent flipping. This however is obviated by the arrangement of FIG. 2. More particularly, when bias current is on the trailing edge 25 of waveform 22, this along with the reverse current through Josephson junction J2 causes Josephson junction J2 to flip, providing output pulse 32, shown in FIG. 2A, thus sending current back in the other direction to effectively cancel the current due to the flipping of J1. Thus, the circuit is ready for the next input pulse.

Figure 3:
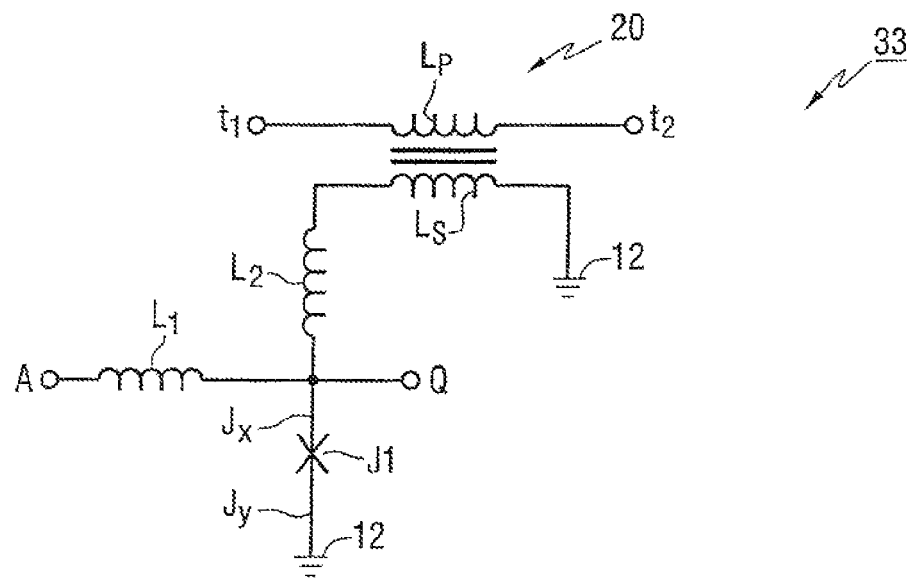
FIG. 3 illustrates another embodiment of the present invention.
Figure 3A:
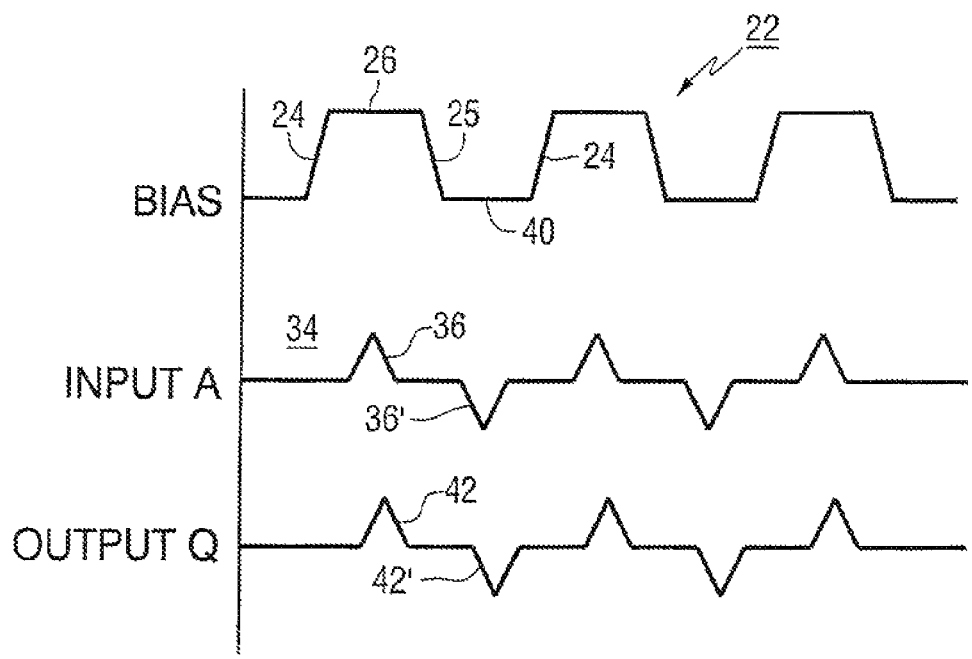
FIG. 3A illustrates waveforms associated with the circuit of FIG. 3.

A single flux quantum output pulse similar to that provided by the circuit of FIG. 2 may be realized with the circuit 33 of FIG. 3, however, with one less Josephson junction. This is accomplished with the provision of input pulse waveform 34 shown in FIG. 3A. The input pulse 34 waveform includes a positive portion 36 which occurs during the upper horizontal portion 26 of waveform 22, followed by a negative portion 36' which occurs during the lower horizontal portion 40 of waveform. 22.

When Josephson junction J1 flips, it generates a positive output pulse 42 sending current through inductor $L_2$ and winding $L_S$ to ground 12. Negative input pulse 36' causes Josephson junction J1 to flip in an opposite direction to cancel such current allowing it to reset for the next applied pulse and causing a negative output pulse 42' to be generated.

Figure 4:
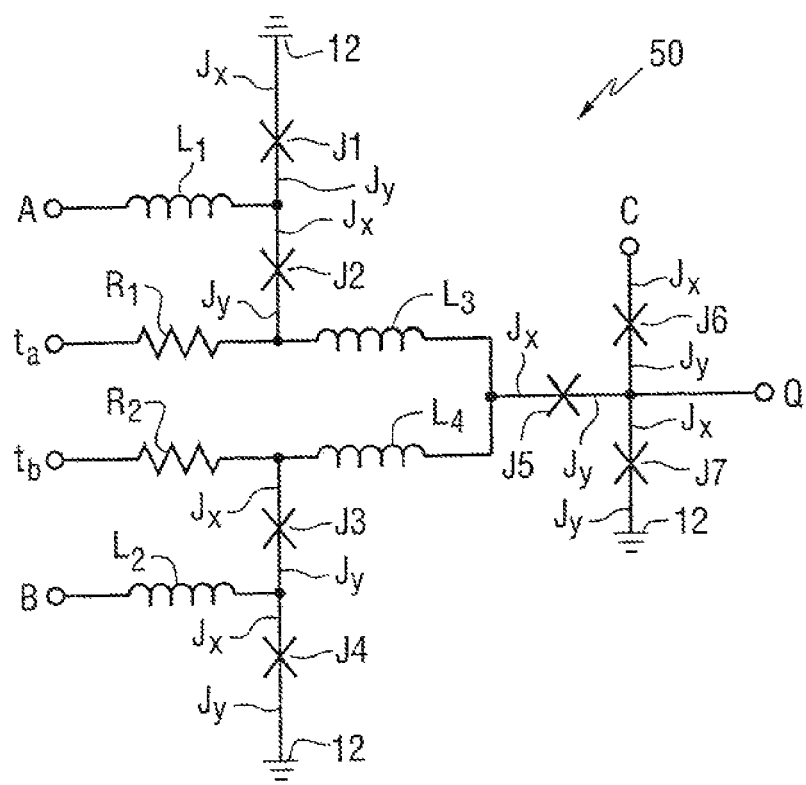
FIG. 4 is a diagram illustrative of a prior art single flux quantum Josephson junction Exclusive OR (XOR) gate.

An Exclusive OR gate is a binary logic gate which will produce an output if one and only one input is present. For example, for a two input Exclusive OR gate, a binary output will be provided only if the two inputs are different. FIG. 4 is illustrative of a prior art Exclusive OR gate 50 implemented with superconducting Josephson junctions. In addition to seven Josephson junctions J1 to J7, the circuit includes four inductors $L_1$ to $L_4$ and two biasing resistors $R_1$ and $R_2$. An input at terminal A or B will result in an output at terminal Q. Such a circuit suffers the same deficiencies as that of FIG. 1 in that there is a wasteful dissipation of power due to the resistors $R_1$ and $R_2$.

Figure 5:
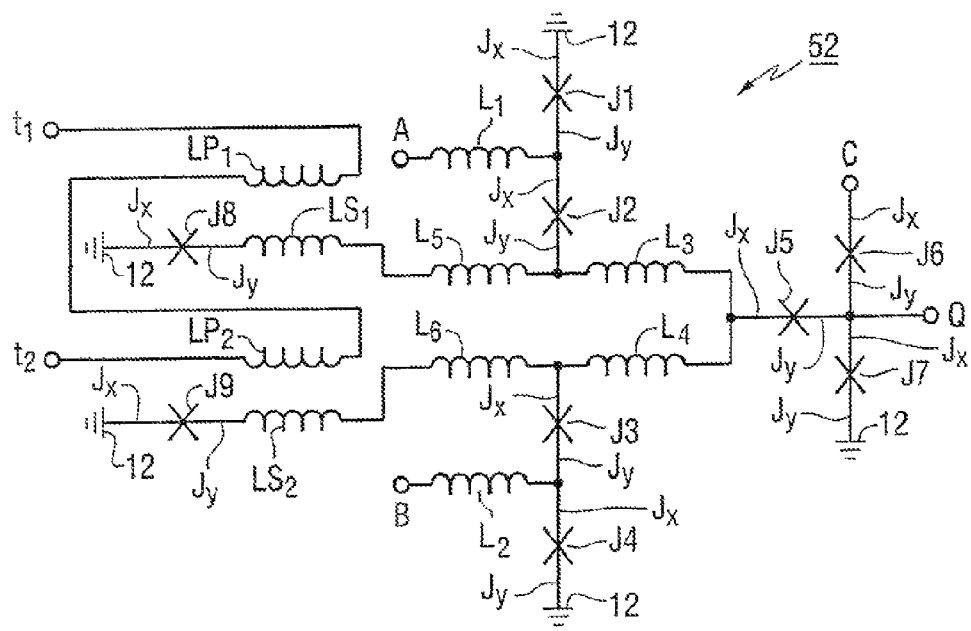
FIG. 5 is a diagram illustrating one embodiment of an Exclusive OR gate in accordance with the present invention.
Figure 5A:
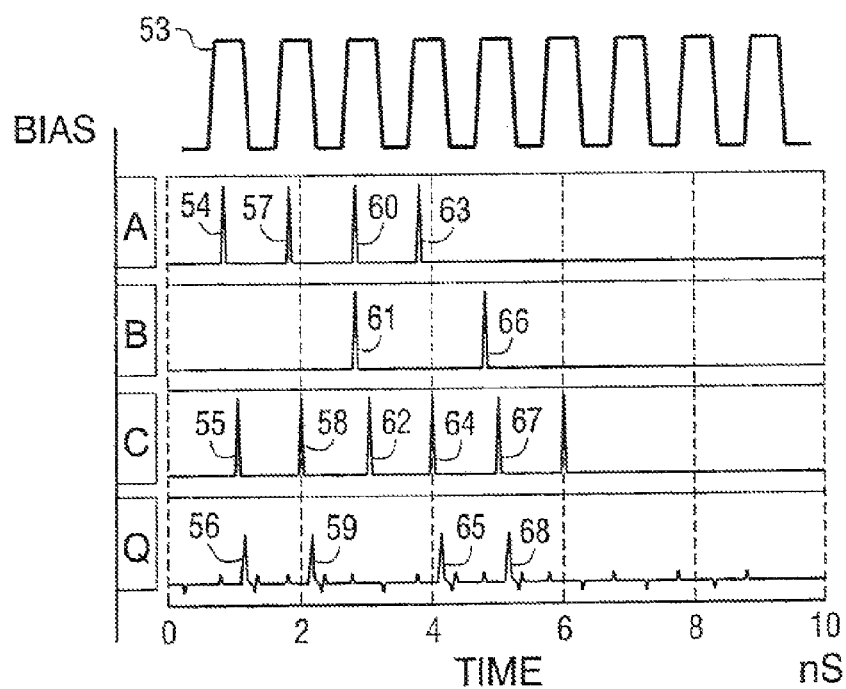
FIG. 5A illustrates waveforms associated with the circuit of FIG. 5.

FIG. 5 illustrates an Exclusive OR gate 52 which eliminates the problem. In FIG. 5, the bias resistors $R_1$ and $R_2$ of FIG. 4 are replaced by a two transformer biasing arrangement which includes a first primary winding $L_{P1}$, a first secondary winding $L_{S1}$, a second primary winding $L_{P2}$, and a second secondary winding $L_{S2}$. An AC bias current designated by numeral 53 is shown in FIG. 5A, is applied across terminals $t_1$ and $t_2$. The circuit also includes a pair of coupling inductors $L_5$ and $L_6$. The remainder of the circuit is the same as FIG. 4.

When the bias current 53 is high, current travels through inductor $L_5$ by transformer action and through Josephson junctions J2 and J1 to ground via $J_x$ of J1. Let it be assumed that an input A, pulse 54, shown in FIG. 5A, is now applied. The combination of bias current and input current flips Josephson junction J1, the result of which is to drive current down through Josephson junction J2, through inductor $L_3$ and through Josephson junctions J5 and J7 to ground via $J_y$ of J7. When clock pulse 55, shown in FIG. 5A, is applied at input C, the critical current in Josephson junction J7 is exceeded and it flips, resulting in a Q output pulse 56.

The flipping of Josephson junction J7 steers current back through Josephson junction J5 and inductor $L_4$ which causes Josephson junction J3 to exceed its critical current. When Josephson junction J3 flips, it reverses the current, preventing current from flowing out the B input. Finally, when Josephson junction J1 flipped, it also sent current back through inductor $L_5$ as well as Josephson junction J8, flipping it, thereby pushing current back through inductors $L_{S1}$ and $L_5$ to cancel the current and to reset the circuit In the scenario shown in FIG. 5A, the next pulse is also an A pulse 57 and the operation just described applies such that when a subsequent clock pulse 58 is applied, an output Q pulse 59 occurs.

The next pulses are the simultaneous provision, or provision in the same cycle, of both an A pulse 60 and B pulse 61. Along with the bias current through Josephson junctions J2 and Josephson junction J3, input pulse 60 causes Josephson junction J1 to flip, sending current through inductor $L_3$ and Josephson junction J5. Similarly, the combination of bias current and input pulse B causes Josephson junction J4 to flip and send current through inductor $L_4$ and Josephson junction J5. The two currents through Josephson junction J5 exceed its critical current and cause it to flip canceling out the currents through $L_3$ and $L_4$ such that when clock pulse 62 is provided, Josephson junction J7 has insufficient current to flip it, and thus no output pulse Q is provided.

When Josephson junctions J1 and J4 flipped, they also sent current back through inductors $L_5$ and $L_6$ as well as Josephson junctions J8 and J9. On the downward slope of waveform 53, current is added to Josephson junctions J8 and J9, flipping them, thereby pushing current back through inductors $L_{S1}$ and $L_5$ and $L_{S2}$ and $L_6$ to cancel the current to reset the circuit.

The next scenario of FIG. 5A is the provision of only a B pulse 66. When the B pulse 63 is provided, it along with bias current through inductor $L_6$ and Josephson junction J3 causes Josephson junction J4 to flip, sending current up through Josephson junction J3, inductor $L_4$, Josephson junction J5 and down through Josephson junction J7. When clock pulse 67 is applied, it is sufficient to flip Josephson junction J7 to provide the Q output 68.

When Josephson junction J7 flips it also steers current back through Josephson junction J5, inductor $L_3$ and Josephson junction J2, which flips to reverse the current and prevent current from coming out the A input. Finally, when Josephson junction J4 flipped, it also sent current back through inductor $L_6$ as well as Josephson junction J9, flipping it, thereby pushing current back through inductors $L_{S2}$ and $L_6$ to cancel the current to reset the circuit.

Figure 6:
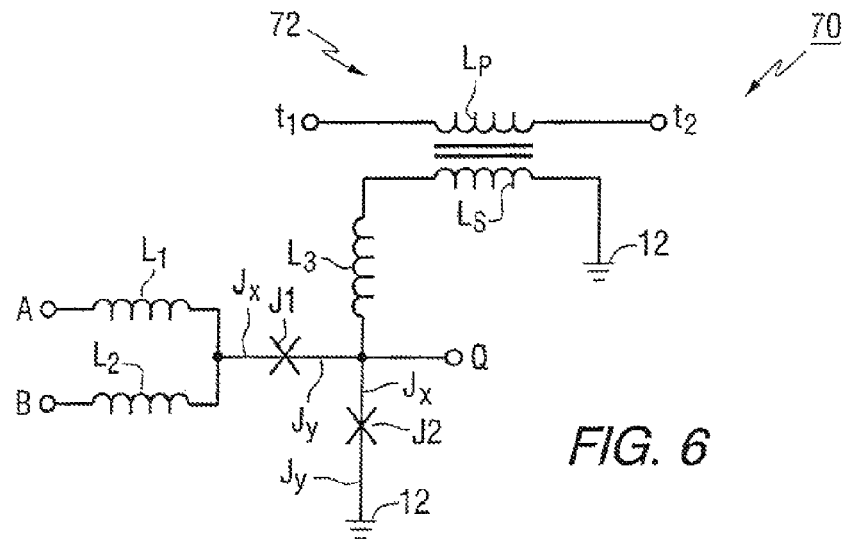
FIG. 6 is diagram illustrating still another embodiment of an Exclusive OR gate in accordance with the present invention.

Referring now to FIG. 6, illustrated is another Exclusive OR gate 70 and one which eliminates the need for an explicit clock and further reduces the number of Josephson junctions required. The circuit includes a biasing transformer 72 having a primary winding $L_P$ and a secondary winding $L_S$ which provides bias current 74 shown in FIG. 6A through inductor $L_3$ and Josephson junction J2. Input A is coupled to Josephson junction J2 via a first input inductor $L_1$ and Josephson junction J1, and input B is coupled to Josephson junction J2 via a second input inductor $L_2$ and Josephson junction J1.

Figure 6A:
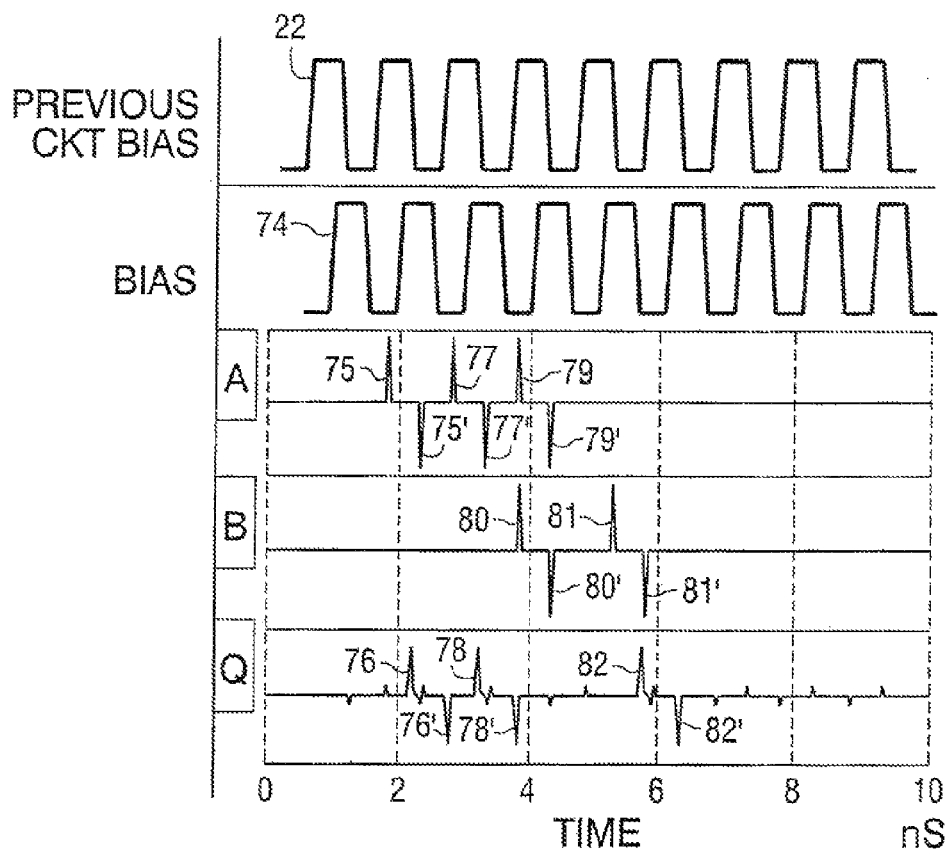
FIG. 6A depicts waveforms associated with the circuit of FIG. 6.

Inputs A and B are supplied by respective prior circuits, each as shown in FIG. 3, and bias waveform 22 in FIG. 6A is the waveform applied to those prior circuits.

With an A input 75 occurring prior to the rising edge of waveform 74, current flows through inductor $L_1$, Josephson junction J1 and through Josephson junction J2. When the applied bias current is of sufficient value, Josephson junction J2 will flip resulting in a Q output 76. As before, current through $L_3$ and $L_S$ is counteracted by the negative portion 75' of the input pulse. FIG. 6A also illustrates a second A pulse 77 resulting in a Q output 78.

A third A pulse 79 in FIG. 6A occurs simultaneously with, or in the same cycle as a B pulse 80. In such a case, Josephson junction J1 has sufficient current to flip and since Q will still be grounded through Josephson junction J2, no output will occur and the flipping action of Josephson junction J1 will cancel out the input currents.

The scenario of FIG. 6A also shows an input B pulse 81. The operation is similar to an A pulse in that Josephson junction J2 will flip when supplied with sufficient bias current, resulting in a Q output 82. Resetting will occur with the negative portion 81' of the B input pulse.

Figure 7:
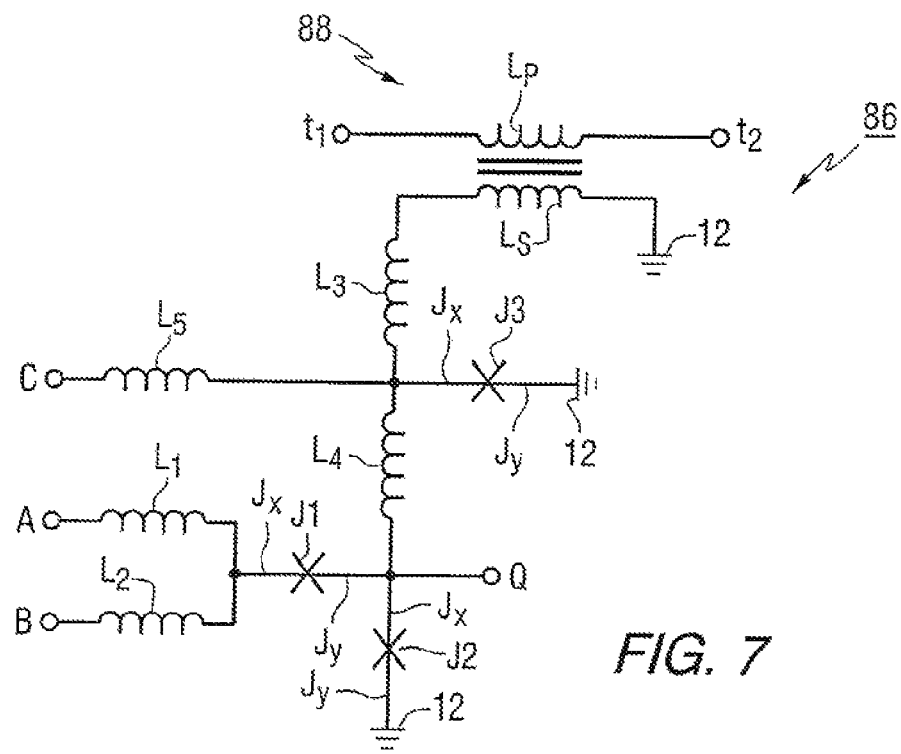
FIG. 7 is diagram illustrating yet another embodiment of an Exclusive OR gate in accordance with the present invention.

Referring now to FIG. 7, shown thereat is another Exclusive OR gate 86, having a bias transformer 88 with primary and secondary windings $L_P$ and $L_S$. The phasing of two different waveforms is not needed as in FIG. 6A since the circuit of FIG. 7 includes a provision for a clock pulse at C. Inputs A and B are coupled to Josephson junctions J1 and J2 through respective first and second input inductors $L_1$ and $L_2$. Third and fourth inductors $L_3$ and $L_4$ connect $L_S$ with Josephson junction J2 and a clock pulse at C is applied through input inductor $L_5$ to Josephson junction J3.

Figure 7A:
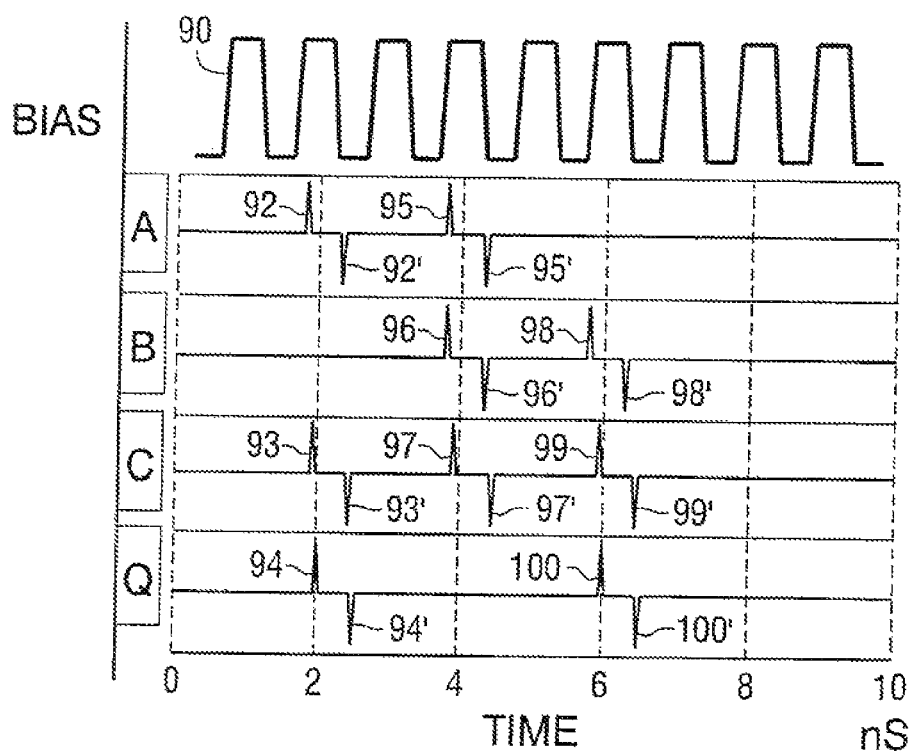
FIG. 7A illustrates waveforms associated with the circuit of FIG. 3.

As shown in FIG. 7A, the bias waveform is designated by numeral 90. When waveform 90 is high, an A pulse 92, when applied, sends current through Josephson junction J2, but not enough to flip it. Bias current is directed through inductor $L_3$ and Josephson junction J3 to ground. When clocking pulse 93 is applied at C, the predominance of current goes through Josephson junction J3 to cause it to flip. When this happens, Josephson junction J3 sends current down through inductor $L_4$ and Josephson junction J2 causing it to flip and produce a Q output 94 and send current back up through inductor $L_4$ and Josephson junction J3. The negative portion 92' of the input pulse resets the circuit for the next pulse, as previously described.

The scenario continues with both an A pulse 95 and B pulse 96 being provided simultaneously or in the same cycle. When this occurs, Josephson junction J1 has sufficient current to flip which deprives Josephson junction J2 of the necessary current to flip such that no output signal is generated.

Then next pulse shown is a B pulse 98 which, when clock pulse 99 is provided, will cause an output pulse 100 in a similar manner previously described with respect to the provision of an A pulse.

Figure 8:
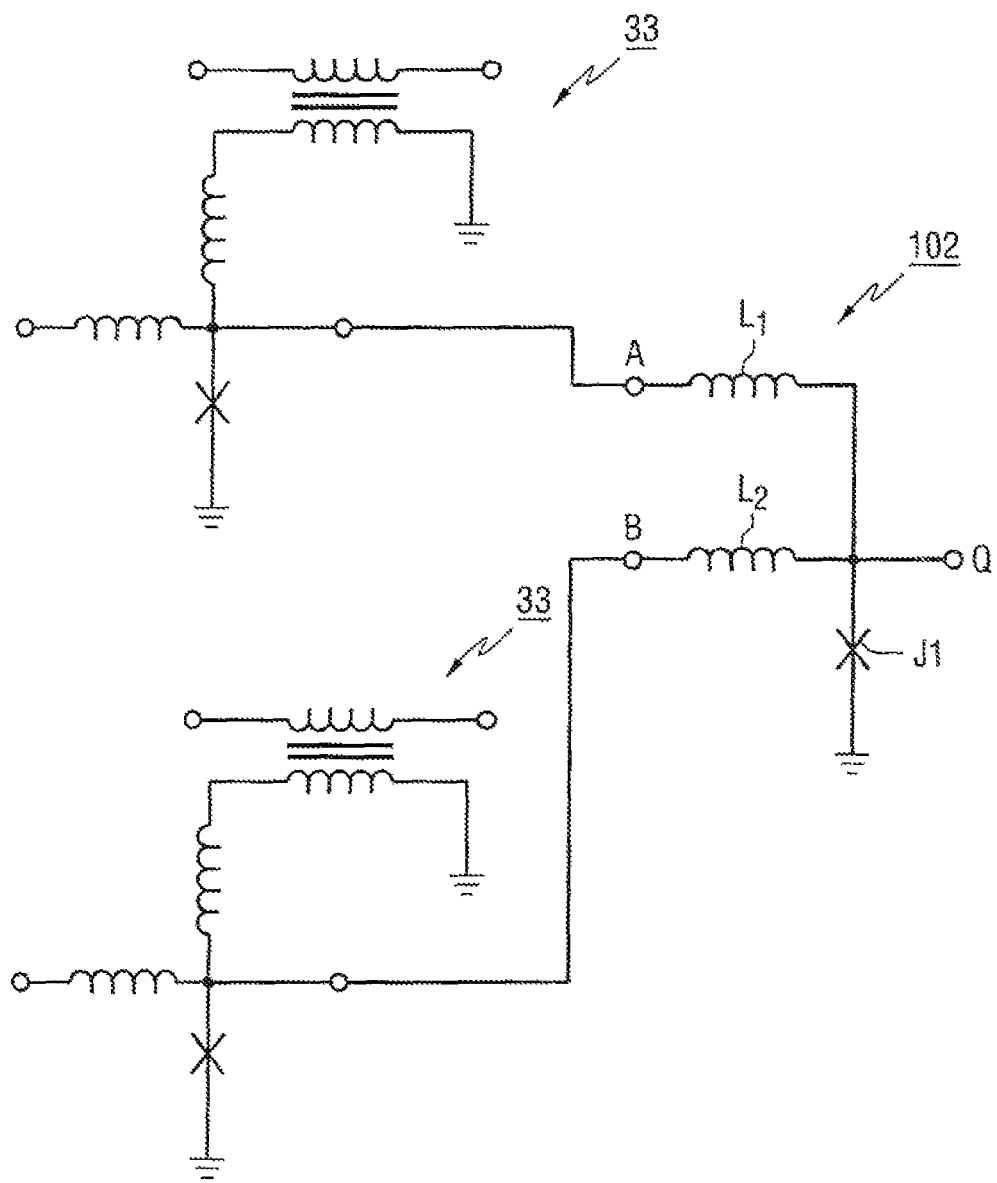
FIG. 8 illustrates an AND gate in accordance with the present invention.

Next, an AND gate is a circuit which will provide an output only if all of its inputs are present. FIG. 8 illustrates a two input AND gate 102 in accordance with the principles of the present invention. As shown, AND gate 102 includes a Josephson junction J1 which will provide an output pulse at Q when it flips. First and second inputs A and B are connected to Josephson junction J1 through respective first and second input inductors $L_1$ and $L_2$. The A and B inputs are derived from respective circuits 33, previously described with respect to FIG. 3. If there is only one input, due to the superconducting nature of the circuit, the input is stored as a persistent current flowing through $L_1$ (or $L_2$) to ground, which is not sufficient to flip J1 so that there is no output. The circuit is then reset by the negative half cycle of the input pulse.

When both inputs A and B are present, and only when both are present, the current through Josephson junction J1 exceeds the critical current such that Josephson junction J1 will flip, providing an output signal indicative of an AND state.

Figure 9:
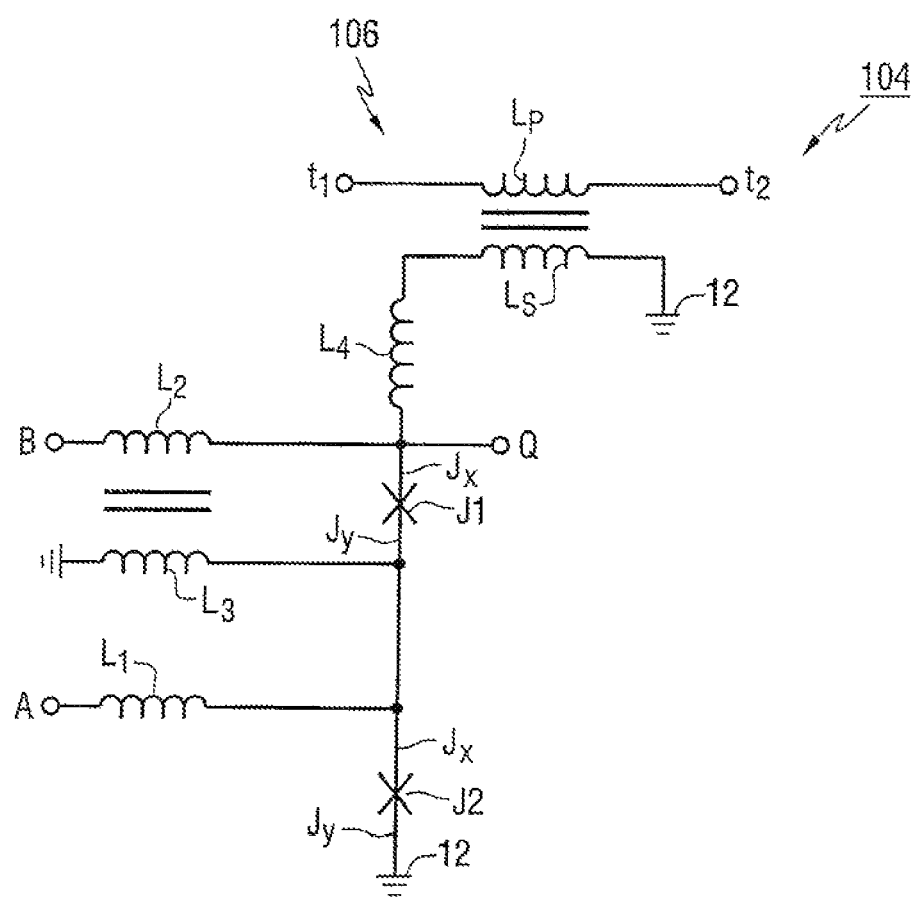
FIG. 9 illustrates an OR gate in accordance with the present invention.

Referring now to FIG. 9, an OR gate is a circuit which will provide an output if any or all of its inputs are present. FIG. 9 is illustrative of a two input OR gate 104 in accordance with the principles of the present invention. The OR gate 104 includes biasing transformer 106 having primary and secondary windings $L_P$ and $L_S$, with winding $L_S$ being connected in series with inductor $L_4$, and Josephson junctions J1 and J2.

The A input is coupled to Josephson junction J2 by a first input inductor $L_1$ while the B input is coupled to Josephson junction J1 by a second input inductor $L_2$, where the inductance of $L_2$ is much greater than the inductance of $L_1$. An inductor $L_3$ is in a mutually coupled arrangement with inductor $L_2$ and has a comparable inductance value. An output Q is connected to Josephson junction J1.

With a bias current established through Josephson junction J2, an input A pulse will flip it resulting in a Q output. When Josephson junction J2 flips it sends current up through Josephson junction J1, inductor $L_4$ and secondary winding $L_S$ to ground. Current also flows back through inductors $L_2$ and $L_3$ in the same direction but since the inductor values are so high, this current is very low and has no effect on prior circuits. A negative cycle of the input A pulse will reset the circuit, as previously explained.

When a B pulse is applied, current in $L_2$ induces current in $L_3$ in an opposite direction. Even though the inductances of $L_2$ and $L_3$ are large, the total loop inductance is small and similar in value to the inductance of inductor $L_1$. This allows the B pulse to flip Josephson junction J1, which already has bias current. When Josephson junction J1 flips an output is provided at Q and current is sent up through inductor $L_4$ and secondary winding $L_S$ to ground. The subsequent negative portion of the B pulse will reset the circuit.

If both an A and B pulse are present, both Josephson junctions J1 and J2 flip, as previously explained. In such instance the output pulse at Q will be twice the size of a normal output pulse since the pulses caused by Josephson junctions J1 and J2 add. Since it is desired to have all pulses of uniform value, this may be rectified by feeding the output pulse to a subsequent circuit such as described in FIG. 3, which will then convert the double sized pulse to a normal sized one.

The foregoing detailed description merely illustrates the principles of the invention. It will thus be appreciated that those skilled in the art will be able to devise various arrangements which, although not explicitly described or shown herein, embody the principles of the invention and are thus within its spirit and scope.

What is claimed:

1. A superconducting single flux quantum circuit, comprising:
   a Josephson junction configured to flip and generate an output pulse when the current through the Josephson junction exceeds a critical value;
   a flux-powered biasing arrangement that provides a bias current to the Josephson junction; and
   an input for supplying an input pulse to the Josephson Junction, wherein the input pulse and the bias current cause the current through the Josephson junction to exceed its critical value.

2. A circuit according to claim 1, wherein the circuit is configured to reset for a subsequent input pulse upon receiving a cancellation current to cancel the current generated by the flipping of the Josephson junction.

3. A circuit according to claim 2, wherein the input pulse has a positive portion followed by a negative portion, the negative portion providing the cancellation current to cancel the current generated by the flipping of the Josephson junction.

4. A circuit according to claim 2, wherein the cancellation current is generated by the flipping of at least one additional Josephson junction in the circuit.

5. A circuit according to claim 4, wherein the flipping of the at least one additional Josephson junction is caused by the combination of the reversing of the bias current due to the reversing of the AC waveform and the input pulse from the Josephson junction.

6. A circuit according to claim 1, wherein the flux-powered biasing arrangement comprises a primary winding for receiving an AC waveform and a secondary winding connected to the Josephson junction for supplying the bias current thereto derived from the AC waveform.

7. A circuit according to claim 6, wherein the AC waveform defines a trapezoidal waveform.

8. A circuit according to claim 6, wherein one end of the secondary winding is connected to an inductor, with the other end of the inductor being connected to the Josephson junction; and wherein a second Josephson junction is connected to the other end of the secondary winding.

9. A circuit according to claim 6, wherein one end of the secondary winding is connected to an inductor, with the other end of the inductor being connected to the Josephson junction and the other end of the secondary winding being connected to ground.

10. A circuit according to claim 6, wherein the Josephson junction is a first Josephson junction having first and second terminals, and further comprising:
    a second Josephson junction having first and second terminals;
    a first inductor and a second inductor defining input inductors;
    first and second inputs for receiving input pulses connected to one end of respective ones of the input inductors;
    the second ends of the first and second inductors being commonly connected to a terminal of the first Josephson junction;
    the other terminal of the first Josephson junction being connected to a terminal of the second Josephson junction; and wherein one end of the secondary winding connected to a third inductor, with the other end of the third inductor connected to the terminal of the second Josephson junction,
    the circuit forming an Exclusive OR gate.

11. A circuit according to claim 6, wherein the Josephson junction is a first Josephson junction having first and second terminals, and further comprising:
    a second and a third Josephson junction each having a respective first and second terminals;
    first, second and third inductors defining input inductors;
    first and second inputs for receiving input pulses connected to one end of respective ones of the first and second inductors,
    the second ends of the first and second inductors being commonly connected to a terminal of the first Josephson junction;
    the other terminal of the first Josephson junction being connected to a terminal of the second Josephson junction; and wherein
    one end of the secondary winding connected to a fourth inductor, with the other end of the fourth inductor being connected to a first end of a fifth inductor;
    the second end of the fifth inductor being connected to the terminal of the second Josephson junction;
    a clock input connected to one end of the third inductor;
    the other end of the third inductor being connected to the junction between the fourth and fifth inductors and to a terminal of the third Josephson junction, with the circuit forming an Exclusive OR gate.

12. A circuit according to claim 6, wherein the Josephson junction includes a first terminal and a second terminal and further comprising:
    a first inductor and a second inductor defining input inductors;
    a first input and a second input for receiving input pulses connected to one end of respective ones of the first and second inductors;
    the second ends of the first and second inductors connected to one of the first or the second terminal of the Josephson junction;
    an output connected to the terminal of the Josephson junction, with the circuit forming an AND gate.

13. A circuit according to claim 6, wherein the Josephson junction is a first Josephson junction having first and second terminals, and further comprising:
    a second Josephson junction having a first and second terminal;
    a first inductor and a second inductor defining input inductors;
    a third inductor inductively coupled to the second inductor;
    the first inductor being connected to a first terminal of the second Josephson junction;
    the second inductor being connected to the first terminal of the first Josephson junction;
    a fourth inductor connected between one end of the secondary winding and the first terminal of the first Josephson junction;
    the third inductor being connected to the junction between the first and second Josephson junctions, with the circuit forming an OR gate.

14. A circuit according to claim 1, wherein the bias current provided by the flux-powered biasing arrangement is an AC bias current, wherein the input pulse is provided substantially concurrently with each pulse of the AC bias current to cause the current through the Josephson junction to exceed its critical value and flip.

15. A circuit according to claim 1, wherein the Josephson junction is coupled to an output node on which the output pulse is provided, wherein the bias current is provided on a first signal path that is provided to the output node, and wherein the input pulse is provided on a second signal path that is provided to the output node.

16. A circuit according to claim 15, wherein the Josephson junction interconnects the output node and ground.

* * * * *